(12) United States Patent
Farjadrad et al.

(10) Patent No.: US 7,577,891 B2
(45) Date of Patent: Aug. 18, 2009

(54) METHOD AND APPARATUS FOR EXTENDING DECODING TIME IN AN ITERATIVE DECODER USING INPUT CODEWORD PIPELINING

(75) Inventors: Ramin Farjadrad, Mt. View, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 321 days.

(21) Appl. No.: 11/442,485

(22) Filed: May 26, 2006

(65) Prior Publication Data

US 2007/0011573 A1    Jan. 11, 2007

Related U.S. Application Data

(60) Provisional application No. 60/685,481, filed on May 27, 2005.

(51) Int. Cl.
*H03M 13/00*    (2006.01)
(52) U.S. Cl. ................... 714/752; 714/786; 714/799
(58) Field of Classification Search .......... 714/752, 714/786
See application file for complete search history.

(56) References Cited

U.S. PATENT DOCUMENTS

| | | | |
|---|---|---|---|
| 5,717,394 A * | 2/1998 | Schwartz et al. ............... 341/51 |
| 6,182,261 B1 * | 1/2001 | Haller et al. ................. 714/758 |
| 6,557,139 B2 * | 4/2003 | Bohnke ........................ 714/758 |
| 7,133,853 B2 * | 11/2006 | Richardson et al. ........... 706/15 |
| 7,237,181 B2 * | 6/2007 | Richardson ................. 714/780 |
| 7,412,004 B2 * | 8/2008 | Faller ........................ 375/242 |
| 2005/0138520 A1 * | 6/2005 | Richardson ................. 714/755 |

OTHER PUBLICATIONS

Kschischang, Frank R. et al, "Factor Graphs and the Sum-Product Algorithm," IEEE Transaction on Information Theory, vol. 47, No. 2, Feb. 2001, pp. 498-519.
Winstead, Chris, "Analog Iterative Error Control Decoders," Department of Electrical and Computer Engineering, Edmonton, Alberta, Spring 2004, pp. 1-251.

* cited by examiner

*Primary Examiner*—Esaw T Abraham
(74) *Attorney, Agent, or Firm*—Sawyer Law Group P.C.

(57) ABSTRACT

A decoder architecture and method for implementing a decoder are provided. In one implementation, the decoder architecture includes an input buffer configured to receive a plurality of codewords to be processed, and includes an iterative decoder configured to receive a first codeword from the input buffer and process the first codeword. The iterative decoder processes the first codeword only for an amount of time required for the first codeword to become substantially error free. The decoder architecture further includes logic coupled to each of the iterative decoder and the input buffer. The logic is configured to determine when the first codeword processed by the decoder becomes substantially error free. The logic further generates a signal for loading a second codeword from the input buffer into the iterative decoder responsive to the logic determining when the first codeword becomes substantially error free.

19 Claims, 4 Drawing Sheets

METHOD AND APPARATUS FOR EXTENDING DECODING TIME IN AN ITERATIVE DECODER USING INPUT CODEWORD PIPELINING

CROSS-REFERENCE TO RELATED APPLICATIONS

This application claims benefit under 35 USC 119(e) of Provisional Application No. 60/685,481, filed on May 27, 2005.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders include low density parity check (LDPC) decoders, Hamming decoders, Turbo decoders, and the like.

The structure of an iterative error correcting decoder can be represented graphically by a factor graph. A factor graph consists of nodes and edges, where the edges are simply the wire connections between the nodes, while a node represents a function of its inputs. For example, in a low density parity check (LDPC) factor graph, there are two types of nodes representing two distinct functions—i.e., "equality constraint" and "parity check". According to the IEEE 802.3an (10GBASE-T) standard, the proposed LDPC decoder consists of (2048) equality constraint nodes and (384) parity check nodes. Each equality constraint node has (6) bidirectional connections to corresponding parity check nodes and each parity check node has a total of (32) bidirectional connections to corresponding equality constraint nodes. This results in a factor graph with network matrix of (12,228) connections. The probabilities associated with received bit values iterate between these two node functions to finally resolve the most probable value of each data bit.

LDPC code is specified by a parity check matrix (which is commonly referred to as an H matrix) having a very few number of "ones" per row. An example of an H matrix 100 is shown in FIG. 1. The length of each codeword is equal to the number of columns in the H matrix 100. In one example, each codeword is created such that the parity of each set of bits corresponding to the "ones" in a row is even. The number of rows corresponds to the number of parity checks that the codeword must satisfy. Therefore, if all errors in a received codeword are corrected by the decoder, all parity checks must be satisfied for the output codeword.

An important feature of an iterative decoder is the number of iterations that the iterative decoder can perform on an input codeword in a given amount of time as it relates to the bit error rate (BER) of the iterative decoder. A higher number of iterations results in a better BER performance of an iterative decoder. Therefore, to maximize the performance of a single iterative decoder, it is always preferred to have it do higher number of iterations to go through a certain number of equality constraint and parity check nodes (which determines the BER performance of a given iterative decoder). Accordingly, there is a trade off between the number of iterations an iterative decoder can perform in a time interval of each data codeword versus the power and complexity of the iterative decoder. In a digital iterative decoder, one can increase the clock frequency, increase the gate sizes, add more flip-flops between logic stages, adopt different implementation architectures, and/or run at higher supply voltage in order to get more iterations per codeword at cost of more power. More iterations can also be achieved by pipelining two or more iterative decoders in series, so that one iterative decoder works on the decoded output codeword of the prior iterative decoder. This approach again translates into more area and power.

BRIEF SUMMARY OF THE INVENTION

In general, in one aspect, this specification describes a decoder architecture that includes an input buffer configured to receive a plurality of codewords to be processed, and includes an iterative decoder configured to receive a first codeword from the input buffer and process the first codeword. The iterative decoder processes the first codeword only for an amount of time required for the first codeword to become substantially error free. The decoder architecture further includes logic coupled to each of the iterative decoder and the input buffer. The logic is configured to determine when the first codeword processed by the decoder becomes substantially error free. The logic further generates a signal for loading a second codeword from the input buffer into the iterative decoder responsive to the logic determining when the first codeword becomes substantially error free.

Implementations can include one or more of the following features. The input buffer can be configured to receive each of the plurality of codewords to be processed at a pre-determined fixed rate. A time difference between the pre-determined fixed rate at which the input buffer receives a given codeword and a rate at which the input buffer outputs a given codeword to the decoder can be accumulated over several codewords. The accumulated time difference can provide additional time for the decoder to decode a worst case codeword that requires longer than a pre-determined decoding time to become substantially error free. The pre-determined fixed rate can correspond to a value between a maximum time required for the decoder to process a worst case codeword and a minimum time required to decode each of a majority of the plurality of codewords. The decoder architecture can further include a counter to limit a maximum amount of time for a given codeword to be processed by the decoder. The decoder architecture can further include an output buffer configured to receive codewords from the decoder and output each codeword at a rate synchronized to the pre-determined frequency. The decoder can be an iterative decoder. The iterative decoder can comprise one of a low density parity check (LDPC) decoder, a Hamming decoder, or a Turbo decoder. The logic can determine that the first codeword processed by the decoder has become error free (or substantially error free) upon the first codeword passing all parity checks of an H matrix associated with the iterative decoder.

In general, in another aspect, this specification describes a method for decoding a plurality of codewords. The method includes loading a plurality of codewords to be processed into an input buffer; transferring a first codeword from the input buffer to a decoder; processing the first codeword in the decoder; determining when the first codeword processed by the decoder becomes substantially error free; reading the error-free first codeword from the decoder into an output buffer; and generating a signal for loading a second codeword from the input buffer into the decoder responsive to a determination that the first codeword has become substantially error free.

Implementations can include one or more of the following features. Loading a plurality of codewords to be processed into an input buffer can comprise loading the plurality of codewords into the input buffer at a pre-determined fixed rate. A time difference between the pre-determined fixed rate at which the input buffer receives a given codeword and a rate at which the input buffer outputs a given codeword to the decoder can be accumulated over several codewords. The accumulated time difference can provide additional time for the decoder to decode a worst case codeword. The pre-determined fixed rate can correspond to a value between a maximum time required for the decoder to process a worst case codeword and a minimum time required to decode each of a majority of the plurality of codewords. The maximum time required for the decoder to process a worst case codeword and the minimum time required to decode each of a majority of the plurality of codewords each can be determined empirically based on application requirements. The method can further include limiting a maximum amount of time for a given codeword to be processed by the decoder. The method can further include providing an output buffer in communication with the decoder. The output buffer can receive codewords from the decoder and outputting each codeword at a rate synchronized to the pre-determined frequency. Determining when the first codeword processed by the decoder becomes substantially error free can comprise determining that the first codeword processed by the decoder has become substantially error free upon the first codeword passing all parity checks of an H matrix associated with the iterative decoder.

Implementations can provide one or more of the following advantages. A novel technique to increase the effective decoding time of a decoder (e.g., an iterative error correcting decoder) by the addition of an input buffer (or FIFO) together with low-complexity combinational logic. In one implementation, the added FIFO and combinational logic consumes significantly less power and area compared to the additional power and area in a conventional approach to reach the same performance.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION OF THE INVENTION

The present invention relates generally to data communications, and more particularly to error correction in data communications. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

An important observation with regards to iterative decoding is that not all received codewords require the same number of iterations to become completely error free (or become substantially error free). The reason is due to the random nature of channel noise, not all received codewords have the same bit probabilities of one or zero—i.e., there is not the same number of errors per codeword. Conventionally, the number of iterations that an iterative decoder must perform is set such that the worst case codeword received (given a target BER) can be fully corrected (or be error free). However, the majority of the received codewords typically require fewer iterations while the worst case codeword can rarely happen, especially for very low BER systems (e.g., high SNR (signal to noise ratio) systems). For example, presentations to the IEEE P802.3an task force describe a minimum of six iterations to correct the all data patterns for a BER=10E-12 scenario. Extensive LDPC simulation has shown that only one out of 1,600,000 received codewords may require 6 iterations, while after only 3 iterations fewer than one out of 5,000 codewords are still in error.

Accordingly, in one implementation, a decoder is provided in which each codeword is processed in the decoder only for the minimum time required for that codeword to become error free. Since each of the majority of the codewords are decoded in fewer iterations or less time than what is needed in the worst case, a decoder implementation that, for example, implements six iterations for each received codeword will end up performing unnecessary iterations, which consume power and time. Thus, according to the present invention, (in one implementation) excess decoding times are saved and accumulated for future codewords that may require higher decoding time. Therefore, one can set the average decoding interval at a value between the maximum required for worst case and the minimum required to decode each of a majority of the received codewords. Determining the minimum and maximum decoding times can be found, e.g., empirically given the decoder H matrix and system conditions and/or application requirements. Other suitable techniques for determining the maximum and minimum decoding times can also be used.

Figure 1:
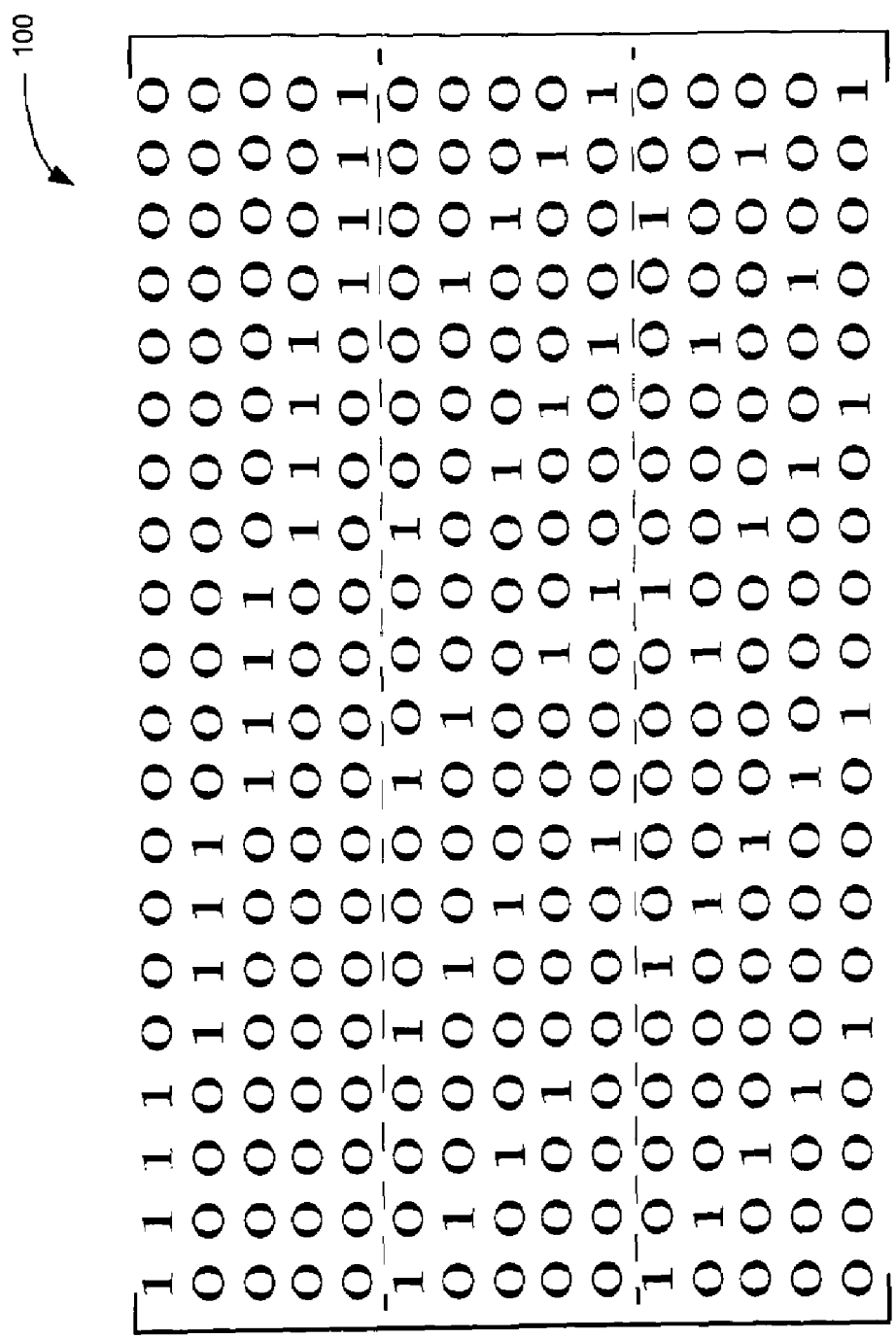
FIG. 1 is a diagram of an H matrix.
Figure 2:
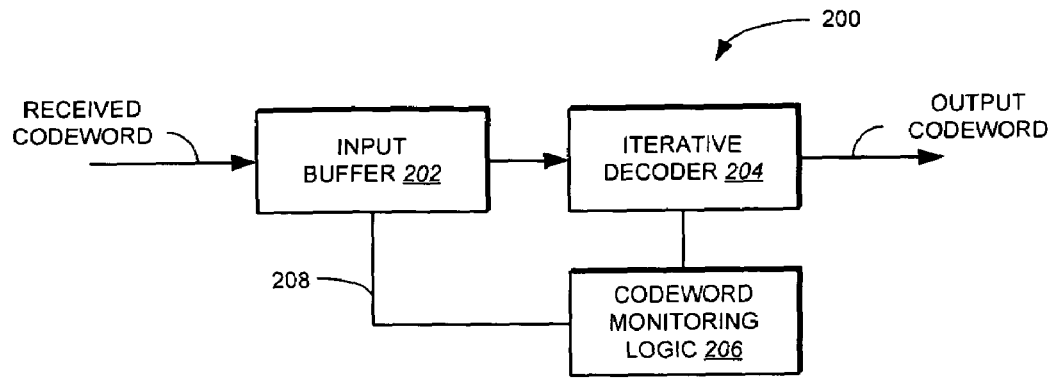
FIG. 2 is a block diagram of a decoder architecture according to one implementation.

FIG. 2 shows a block diagram of a decoder architecture 200 in accordance with one implementation of the present invention. In one implementation, the decoder architecture 200 includes an input buffer 202, an iterative decoder 204, and codeword monitoring logic 206. The input buffer 202 is a memory that stores one or more codewords to be processed by the iterative decoder 204. In one implementation, the input buffer 202 is a FIFO (First-In, First Out) buffer. In one implementation, the input buffer 202 receives codewords at a pre-determined fixed rate. The pre-determined fixed rate can be the average decoding interval as discussed above. In general, the input buffer 202 can receive codewords at a rate that is at least faster than the time required for the decoder to fully correct a worst case codeword, and the input buffer 202 can receive codewords (to be processed by the decoder) at a constant or variable rate. The iterative decoder 204 can be a low density parity check (LDPC) decoder, a Hamming decoder, a Turbo decoder, or the like. The codeword monitoring logic 206 monitors each codeword that is processed by the iterative decoder 204, and generates a strobe signal 208 once a given codeword being processed by the iterative decoder 204 has become error free. The strobe signal 208 loads a next codeword from the input buffer 202 into the iterative decoder 204.

Figure 3:
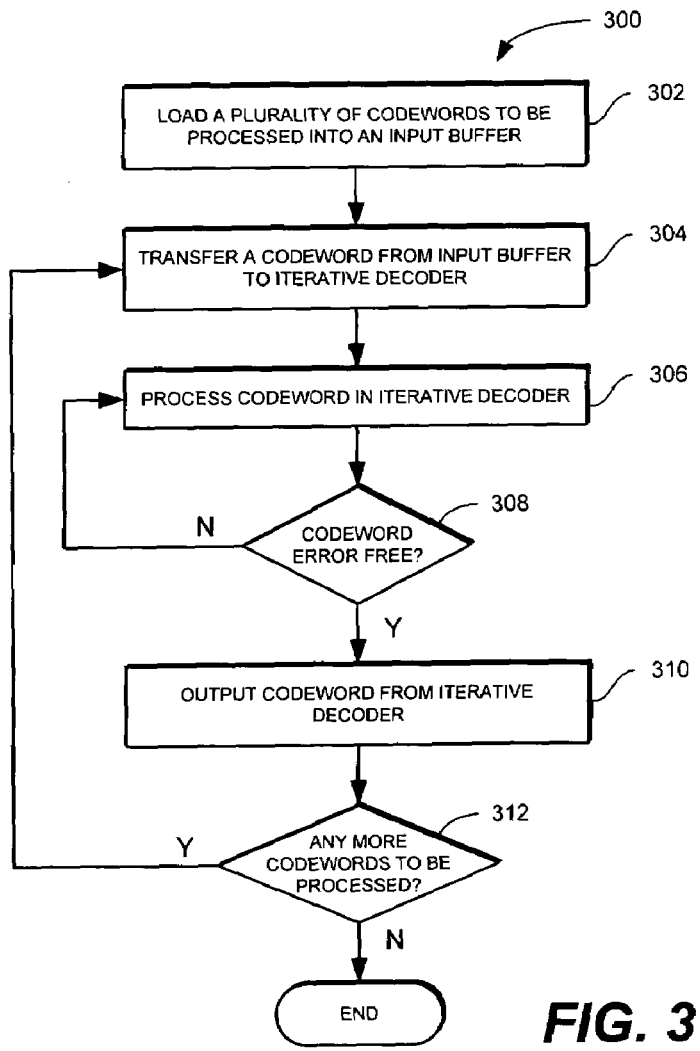
FIG. 3 illustrates a method for decoding a codeword in accordance with one implementation.

FIG. 3 shows a method 300 for processing codewords in accordance with one implementation of the invention. One or more codewords to be processed are loaded into an input buffer (e.g., input buffer 202) (step 302). In one implementation, each codeword is loaded into the input buffer at a pre-determined fixed rate that is at least faster than the time required for an iterative decoder to fully correct a worst case codeword for a given application. The input buffer can receive codewords (to be processed by an iterative decoder) at a constant or variable rate. A codeword is transferred from the input buffer to an iterative decoder (e.g., iterative decoder 204) to be processed (step 304). In one implementation, the transferred codeword is processed iteratively in the iterative decoder until the codeword becomes error free (step 306). A determination is made whether the codeword is error free (e.g., by codeword monitoring logic 206) (step 308). If the codeword is not yet error free, then the iterative decoder continues to process the codeword (e.g., for another iteration). In one implementation, a given codeword becomes error free when the given codeword passes all the parity checks of the H matrix as discussed in greater detail below. Once the codeword becomes error free, the codeword is output from the iterative decoder (step 310). A determination is made whether there are additional codewords to be processed by the iterative decoder (step 312). If there are no additional codewords to be processed, then the method 300 ends. Otherwise, the method 300 returns to step 304 and a next codeword is transferred from the input buffer to the iterative decoder. In one implementation, the codeword monitoring logic generates a strobe signal for loading a next codeword from the input buffer to the iterative decoder.

In one implementation, the accumulation of the excess decoding time over several codewords is the key part of the invention that makes every small extra decoding time very valuable. This is very important because the average decoding time can be chosen close to the minimum decoding time for majority of received codewords. That means the excess times in each cycle can be mostly small, while one can still accumulate large excess time over several cycles. Therefore, a large accumulated time can be allocated to a worst case codeword while still keeping the net average decoding cycle short. In one implementation, a time difference between the pre-determined fixed rate at which the input buffer receives a given codeword and a rate at which the input buffer outputs a given codeword to the iterative decoder is accumulated over several codewords, the accumulated time difference providing additional time for the iterative decoder to decode a worst case codeword (or a codeword that requires a longer time to decode relative to an average decode time for a given application).

Referring back to FIG. 2, delay accumulation can be performed using the input buffer 202 (e.g., a FIFO buffer) to pipeline the input data codeword for a certain number of cycles. In one implementation, input data codewords are loaded into the FIFO buffer at a fixed frequency determined by the input data rate. On the FIFO output, (in one implementation) every time that a codeword decoding is completed, a strobe signal loads in the next codeword from the FIFO buffer into the iterative decoder. In one implementation, to avoid overflow of the FIFO buffer, the average decoding speed is selected such that the average read speed from the FIFO buffer is faster than the fixed write speed. In one implementation, the extra decoding time saved helps in emptying the FIFO buffer which provides for more margin in cases that the iterative decoder experiences a long time before reading a next codeword from the FIFO buffer.

In one implementation, the codeword monitoring logic 206 detects the end of each decoding process by determining when a given codeword passes (or satisfies) all the parity checks of the H matrix. In this specific implementation, parity is checked if the codeword monitoring logic 206 outputs a zero. Alternatively, parity can be checked if the codeword monitoring logic 206 outputs a one. In one implementation, the codeword monitoring logic 206 includes combinational logic configured to perform this function, and send a strobe signal (e.g., strobe signal 208) to the input (FIFO) buffer for the next read. The combinational logic can be implemented in several ways. For example, one method is to take the whole codeword, separately perform all the parity checks, and then do a logic OR on the output of the parity check logic blocks (as shown in the decoder architecture 500 of FIG. 5). That means one would need as many parity check blocks as the number of rows in the H matrix, which can be a very high number and thus a complex solution. For example, the 10GBASE-T LDPC H matrix has 384 rows, in which each row contains 32 "ones". Therefore, we will have 384 parity check blocks each with 32 inputs and thus 31 XOR gates. As a result, we will have 384*31=11904 XOR gates and 382 OR gates to combine the parity results, leading to total of 12,286 gates.

Figure 4:
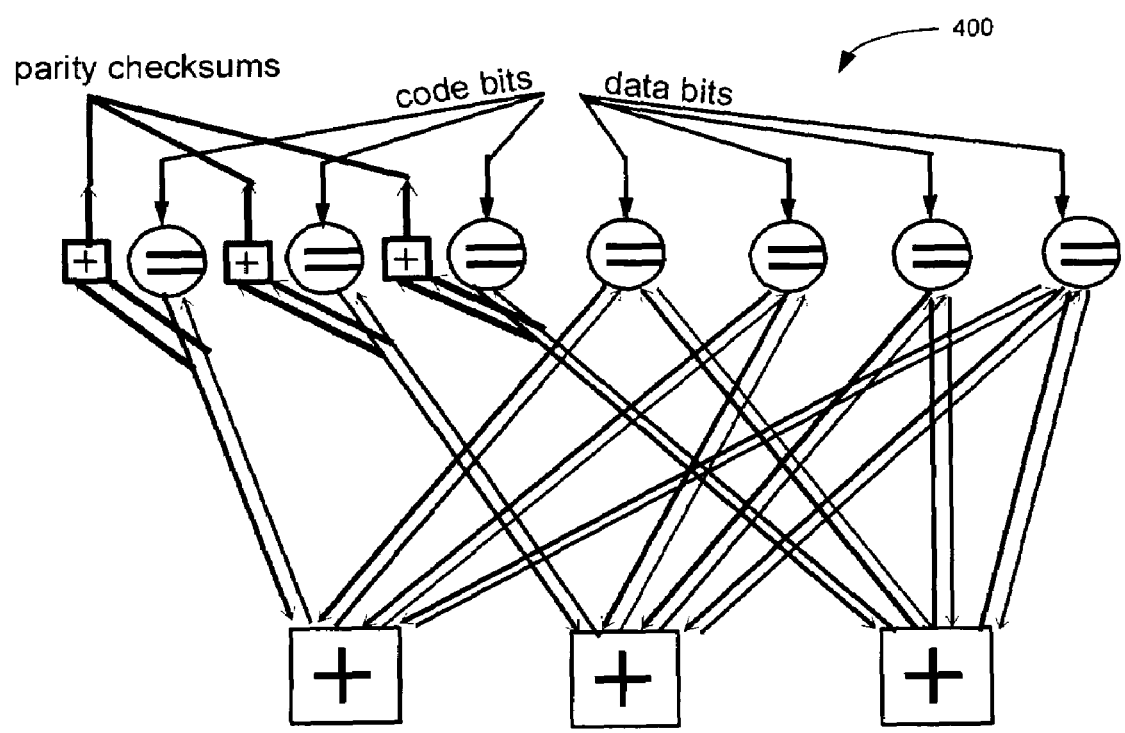
FIG. 4 is a block diagram of a Hamming decoder.

Another method for implementing the combinatorial logic is to actually use the iterative decoder itself to help generate the parity check results. A simple (7,4) hamming decoder 400 (as shown in FIG. 4) will now be used to explain this approach. A code (7,4) Hamming decoder has a codeword 7 bits wide with 7 data bits and 3 code bits. The number of the parity nodes is equal to the number of code bits. The parity nodes of the decoder for each of its inputs generate a corresponding output equal to the parity of all other inputs except for the its own. Therefore, one parity node output can be used to perform a parity sum-product with its corresponding input to calculate the total parity for that parity check. This is represented in FIG. 4 by the bold lines. Then, OR gates can be used to combine their results. This approach significantly reduces the logic required, as it eliminates the need for several post parity checkers. This is especially key for large codes such as 10GBASE-T LDPC decoders where a total of 384 parity check logic blocks with a total of 11904 XOR gates can be saved.

Figure 5:
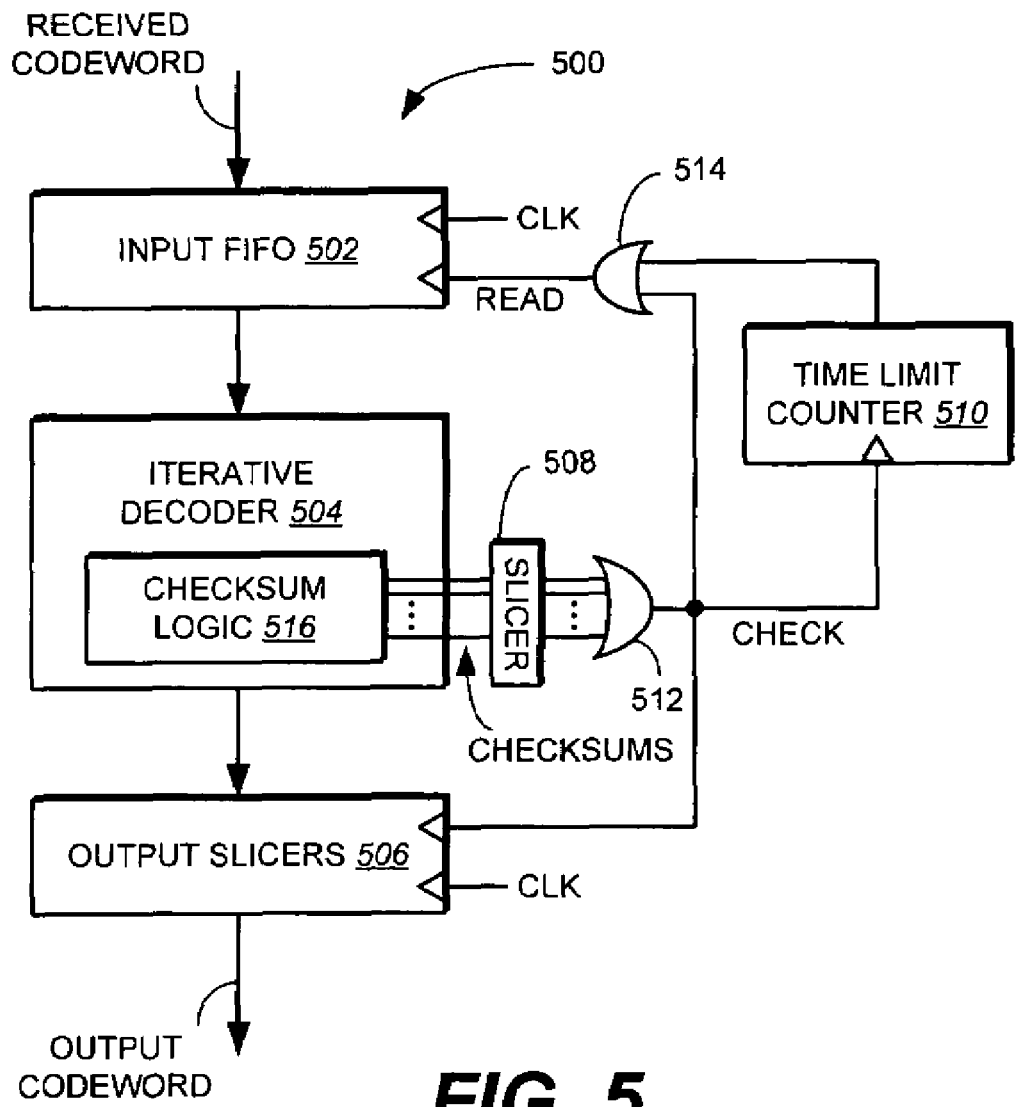
FIG. 5 is a block diagram of a decoder architecture in accordance with the decoder architecture of FIG. 1.

FIG. 5 illustrates a decoder architecture 500 in accordance with one implementation of the invention. In one implementation, the decoder architecture 500 includes an input FIFO 502, an iterative decoder 504, output slicers 506, a slicer 508, a time limit counter 510, and OR gates 512, 514. As shown in FIG. 5, the iterative decoder 504 includes checksum logic 516. In one implementation, the checksum logic 516 calculates the checksum for every parity check of the iterative decoder 504. The checksum outputs are passed through the slicer 508 and then ORed together through OR gate 512, and a final result is used to trigger the next read from the input FIFO 502. In one implementation, to prevent certain codewords from realizing a long decoding time, e.g., falling into trapping sets, the time limit counter 510 limits the maximum decoding time of any input codeword. In this implementation, once the time limit counter 510 has reach its limit of maximum allowable decode time, the time limit counter 510 triggers the next read from the input FIFO 502 through OR gate 514.

In an analog implementation of the iterative decoder 504 in which the checksum outputs are small analog voltages, high-gain amplifiers (not shown) are implemented before the slicer 508. In one implementation, to minimize power consumed by the high-gain amplifiers, the high-gain amplifiers are turned on only for small periods of time to evaluate the analog output. Thus, in the analog implementation of the iterative decoder 504, the checksum values need to be evaluated periodically. This process can be performed intelligently to save power, e.g., the periodic evaluations can be performed closer to the average expected decoding time and not all the time.

In one implementation, the output slicers 506 includes a FIFO (or other suitable type of buffer or memory) that receives codewords output from the iterative decoder 504. In one implementation, the output FIFO (or buffer) guarantees that codewords are output at a fixed rate that is synchronized to the FIFO clock, CLK, used to feed information into the input FIFO 502. The inclusion of the output FIFO is generally important for applications that require the data to come out at a fixed rate.

Various implementations of a decoding architecture have been described. Nevertheless, one of ordinary skill in the art will readily recognize that there that various modifications may be made to the implementations, and any variation would be within the scope of the present invention. For example, though examples described above generally described with respect to an iterative decoder, the techniques are applicable to other types of decoders. In addition, the techniques described herein can be applicable to satellite communications (e.g., DVB-S2 (Digital Video Broadcasting)), MIMO-OFDMA cellular systems, as well as read-channel for hard discs, and other systems. Accordingly, many modifications may be made without departing from the scope of the present invention.

What is claimed is:

1. A decoder architecture comprising:
    an input buffer configured to receive a plurality of codewords to be processed, wherein the input buffer is configured to receive each of the plurality of codewords at a pre-determined fixed rate;
    a decoder configured to receive a first codeword from the input buffer and process the first codeword, the decoder processing the first codeword only for an amount of time required for the first codeword to become substantially error free, wherein an average decoding speed of the decoder is set such that an average read speed of the decoder from the input buffer is faster than the pre-determined fixed rate of receiving the plurality of codewords in the input buffer; and
    logic in communication with each of the decoder and the input buffer, the logic configured to determine when the first codeword processed by the decoder becomes substantially error free, wherein the logic generates a signal for loading a second codeword from the input buffer into the decoder responsive to the logic determining that the first codeword has become substantially error free.

2. The decoder architecture of claim 1, wherein a time difference between the pre-determined fixed rate at which the input buffer receives each of the plurality of codewords and the average read speed of the decoder is accumulated over multiple codewords, the accumulated time difference providing additional time for the decoder to decode a codeword requiring longer than the average decoding speed to become substantially error free.

3. The decoder architecture of claim 1, wherein the pre-determined fixed rate corresponds to a value between a maximum time required for the decoder to process a worst case codeword and a minimum time required to decode each of a majority of the plurality of codewords.

4. The decoder architecture of claim 1, further comprising a counter to limit a maximum amount of time for a given codeword to be processed by the decoder.

5. The decoder architecture of claim 4, further comprising an output buffer configured to receive codewords from the decoder and output each codeword at a rate synchronized to the pre-determined fixed rate.

6. The decoder architecture of claim 1, wherein the decoder is an iterative decoder.

7. The decoder architecture of claim 6, wherein the iterative decoder comprises one of a low density parity check (LDPC) decoder, a Hamming decoder, or a Turbo decoder.

8. The decoder architecture of claim 6, wherein the logic determines that the first codeword processed by the decoder has become substantially error free upon the first codeword passing all parity checks of an H matrix associated with the iterative decoder.

9. The decoder architecture of claim 1 wherein the decoder receives the plurality of codewords at a variable rate from the input buffer.

10. A method for decoding a plurality of codewords, the method comprising:
    loading a plurality of codewords to be processed into an input buffer, wherein the loading the plurality of codewords into the input buffer is at a pre-determined fixed rate;
    transferring a first codeword from the input buffer to a decoder;
    processing the first codeword in the decoder, wherein an average decoding speed of the decoder is set such that an average read speed of the decoder from the input buffer is faster than the pre-determined fixed rate of loading the plurality of codewords into the input buffer;
    determining when the first codeword processed by the decoder becomes substantially error free; and
    generating a signal for loading a second codeword from the input buffer into the decoder responsive to a determination that the first codeword has become substantially error free.

11. The method of claim 10, wherein a time difference between the pre-determined fixed rate at which the input buffer receives each of the plurality of codewords and the average read speed of the decoder is accumulated over multiple codewords, the accumulated time difference providing additional time for the decoder to decode a codeword that requires longer than the average decoding speed to become substantially error free.

12. The method of claim 10, wherein the pre-determined fixed rate corresponds to a value between a maximum time required for the decoder to process a worst case codeword and a minimum time required to decode each of a majority of the plurality of codewords.

13. The method of claim 12, wherein the maximum time required for the decoder to process a worst case codeword and the minimum time required to decode each of a majority of the plurality of codewords are determined empirically based on application requirements.

14. The method of claim 10, further comprising limiting a maximum amount of time for a given codeword to be processed by the decoder.

15. The method of claim 14, further comprising providing an output buffer in communication with the decoder, the output buffer receiving codewords from the decoder and outputting each codeword at a rate synchronized to the predetermined fixed rate.

16. The method of claim 10, wherein the decoder is an iterative decoder.

17. The method of claim 16, wherein the iterative decoder comprises one of a low density parity check (LDPC) decoder, a Hamming decoder, or a Turbo decoder.

18. The method of claim 16, wherein determining when the first codeword processed by the decoder becomes substantially error free comprises determining that the first codeword processed by the decoder has become substantially error free upon the first codeword passing all parity checks of an H matrix associated with the iterative decoder.

19. The method of claim 10 wherein the plurality of codewords are transferred from the input buffer to the decoder at a variable rate.

* * * * *